United States Patent [19]
Nishihara et al.

[11] Patent Number: 5,779,958
[45] Date of Patent: Jul. 14, 1998

[54] METHOD FOR PACKAGING ELECTRONIC DEVICE

[75] Inventors: Syoujirou Nishihara, Fukuoka; Teruaki Nishinaka, Kasuga, both of Japan

[73] Assignee: Matsushita Electric Industrial Co., Ltd., Osaka, Japan

[21] Appl. No.: 782,250

[22] Filed: Jan. 14, 1997

Related U.S. Application Data

[63] Continuation of Ser. No. 360,052, Dec. 20, 1994, abandoned.

[30] Foreign Application Priority Data

Dec. 22, 1993 [JP] Japan .................................. 5-324628

[51] Int. Cl.$^6$ .................................. B29C 33/42; B29C 33/44; B29C 45/02
[52] U.S. Cl. .................. 264/161; 264/272.15; 264/272.17; 264/276
[58] Field of Search ................ 264/272.11, 272.15, 264/272.17, 275, 276, 328.9, 328.12, 161; 425/116, 121, 125

[56] References Cited

U.S. PATENT DOCUMENTS

| | | | |
|---|---|---|---|
| 4,188,708 | 2/1980 | Frederiksen | 264/272.17 |
| 4,822,550 | 4/1989 | Komathu | 264/272.15 |
| 4,861,251 | 8/1989 | Moitzger | 264/272.17 |
| 4,927,580 | 5/1990 | Nasu et al. | 264/272.17 |
| 4,954,308 | 9/1990 | Yabe et al. | 264/272.17 |
| 5,108,955 | 4/1992 | Ishida et al. | 264/272.17 |
| 5,578,261 | 11/1996 | Manzione et al. | 264/272.15 |

FOREIGN PATENT DOCUMENTS

| | | |
|---|---|---|
| 59-95194 | 6/1984 | Japan . |
| 60-110488 | 6/1985 | Japan . |
| 61-46049 | 10/1986 | Japan . |
| 62-197183 | 8/1987 | Japan . |
| 63-77758 | 4/1988 | Japan . |

*Primary Examiner*—Angela Y. Ortiz
*Attorney, Agent, or Firm*—Pollock, Vande Sande & Priddy

[57] ABSTRACT

An electronic device packaging apparatus using molding techniques is provided. This packaging apparatus includes an upper die, a lower die, and a resin injection mechanism. The lower die is designed to mate with the upper die, and includes a cavity block which has an upper block surface and a lower block surface. The upper block surface has formed therein a mold cavity for packaging an electronic device placed between the upper and lower dies with a resin material. The lower block surface has formed therein a groove communicating with the mold cavity. The resin injection mechanism is operable to inject a melted resin material into the mold cavity of the cavity block through the groove formed in the lower block surface of the cavity block.

3 Claims, 9 Drawing Sheets

METHOD FOR PACKAGING ELECTRONIC DEVICE

This application is a continuation of U.S. patent application Ser. No. 08/360,052, filed Dec. 20, 1994, now abandoned.

BACKGROUND OF THE INVENTION

1. Technical Field of the Invention

The present invention relates generally to an apparatus and method for packaging electronic devices, and more particularly to an improved apparatus and method for packaging chips mounted on a circuit substrate with a resin material for physical and electric protection.

2. Background Art

Figure 12:
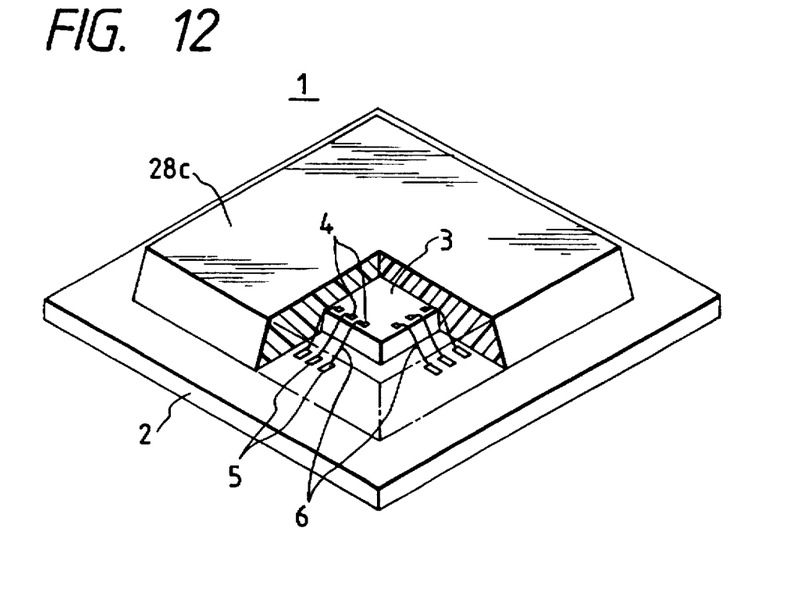
FIG. 12 is a partially cutaway view which shows an electronic device packaged.

Japanese Patent Second Publication No. 61-46049 teaches a packaging method for an electronic device as shown in FIG. 12. The electronic device 1 illustrated has mounted on a circuit substrate 2 a chip 3 cut from a wafer. On an upper surface of the chip 3, electrodes 5 are formed which connect with electrodes formed on an upper surface of the circuit substrate 2 through fine electrically conducting wires 6, respectively. On a bottom surface of the circuit substrate 2, electrodes (not shown) are mounted which connect with the electrodes 5. The chip 3 and the wires 6 are encased in a package 28c for physical and electric protection. The package 28c is molded with a synthetic resin material.

The molding operation is accomplished by retaining the chip 3 mounted on the circuit substrate 2 within a cavity formed in a cavity plate placed between upper and lower dies and then injecting melted resin into the cavity of the cavity plate through a runner to form the package 28c, having the same thickness as that of the cavity plate, within which the chip 3 is encapsulated together with the circuit substrate 2.

In recent years, there is an increasing need for a compact and thin electronic device. In order to reduce the thickness of the package 28c in the conventional molding manner as discussed above, it is necessary to decrease the thickness of the cavity plate to agree with that of the package 28c.

The repeated uses of a thin cavity plate, however, cause the cavity plate to be deformed due to the heat and pressure acting thereon. The use of the cavity plate thus deformed will create a clearance between the cavity plate and the lower die. This causes melted resin injected into the cavity to overflow through the clearance, leading to the formation of flashes (also called burrs) around the package 28c.

SUMMARY OF THE INVENTION

It is therefore a principal object of the present invention to avoid the disadvantages of the prior art.

It is another object of the present invention to provide an electronic device packaging apparatus and method which are capable of forming moldings with no flash repeatedly which may be employed as packages of electronic devices for physical and electric protection.

According to one aspect of the present invention, there is provided an electronic device packaging apparatus for packaging a chip mounted on a circuit substrate with a resin material which comprises a cavity block having a recessed portion formed in a major surface and a groove, formed in a surface opposite the major surface, communicating with the recessed portion, a pressing means for pressing against the major surface of the cavity block a chip-mounted surface of the circuit substrate with the chip being disposed within the recessed portion of the cavity block, and an injection means for injecting a melted resin material into the recessed portion through the groove formed in the cavity block when the circuit substrate is pressed against the major surface of the cavity block.

According to another aspect of the present invention, there is provided a chip-packaging apparatus using a resin material which comprises a cavity block having upper and lower surfaces, the upper surface having formed therein a cavity for receiving a chip mounted on a circuit substrate and a vent outlet for discharging air existing in the cavity. The lower surface has formed therein a groove through which a melted resin material is injected into the cavity. A lower die on which the cavity block is mounted has formed therein a pot in which a raw resin material is received and a runner communicating between the pot and the groove. In addition, a plunger is provided in the pot of the lower die for injecting the resin material which is melted on heating into the cavity of the cavity block through the runner of the lower die. An upper die is engageble with the cavity block, and a moving means moves the upper die into and out of engagement with the cavity block. A pressing block presses the circuit substrate placed between the lower die and the cavity block against the upper surface of the cavity block.

According to a further aspect of the invention, there is provided a process for packaging a chip mounted on a circuit substrate with a resin material which comprises the steps of retaining the chip mounted on the circuit substrate in a recessed portion formed in a major surface of a cavity block, the cavity block having formed in a surface opposite the major surface a groove communicating with the recessed portion. The circuit substrate is pressed against the major surface of the cavity block, and a melted resin material is injected into the recessed portion formed in the cavity block through the groove to package the chip.

According to a still further aspect of the present invention, there is provided an apparatus for packaging an electronic device which comprises an upper die, and a lower die, mating with the upper die, having a cavity block which has a first block surface and a second block surface opposite the first block surface. The first block surface has formed therein a mold cavity for packaging an electronic device placed between the upper and lower dies with a resin material. The second block surface has formed therein a groove communicating with the mold cavity, and a resin injection means for injecting a melted resin material into the mold cavity of the cavity block through the groove formed in the second block surface of the cavity block.

In the preferred mode of the invention, the lower die has a first die surface and a second die surface lowered from the first die surface by a given height. The cavity block is so mounted on the second die surface as to lie flush with the first die surface.

A pot is formed in the first die surface of the lower die which communicates with the mold cavity through the groove formed in the cavity block for supplying the melted resin material into the mold cavity.

The groove formed in the second block surface of the cavity block is defined by tapered walls widening toward the second die surface of the lower die for facilitating easy removal of a resin material hardened and left in the groove.

A plunger is further provided in the pot for sliding movement to inject the melted resin material into the mold cavity.

A vent outlet is formed in the first block surface of the cavity block for discharging air existing in the cavity mold outside the apparatus.

A pressure block is provided in the upper die which is spring-loaded to urge the circuit substrate placed between the upper and lower dies against the cavity block under a given pressure.

An ejector pin is slidably provided in the lower die for separating the cavity block from the lower die.

BRIEF DESCRIPTION OF THE DRAWINGS

The present invention will be understood more fully from the detailed description given hereinbelow and from the accompanying drawings of the preferred embodiment of the invention, which, however, should not be taken to limit the invention to the specific embodiment but are for the purpose of explanation and understanding only.

In the drawings.

DESCRIPTION OF THE PREFERRED EMBODIMENT

Figure 1:
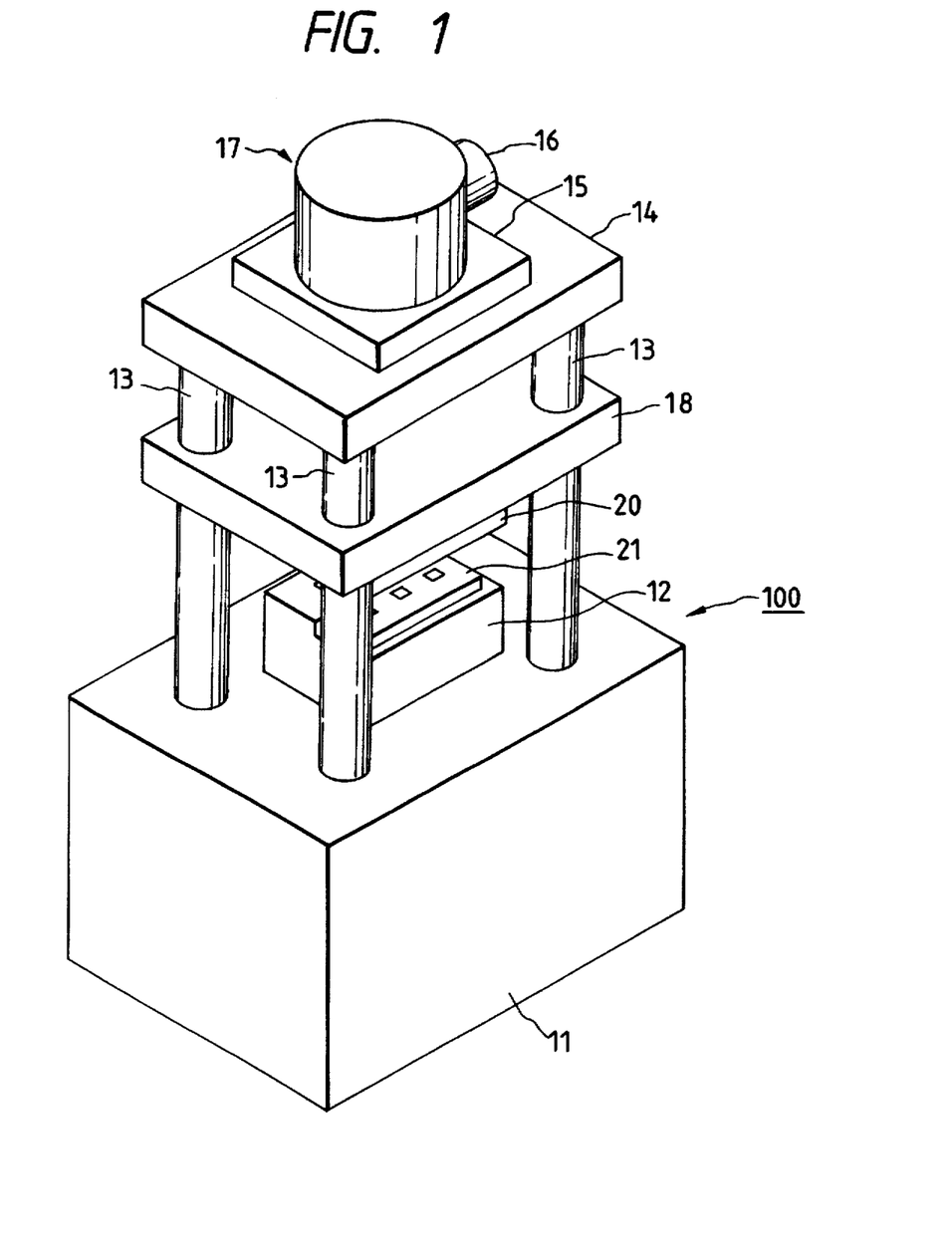
FIG. 1 is a perspective view which shows an electronic device packaging apparatus according to the present invention.

Referring now to the drawings, wherein like numbers refer to like parts in several views, particularly to FIG. 1, there is shown an electronic device packaging apparatus 100 according to the present invention.

The packaging apparatus 100 generally includes a base support 11, a lower die 12, a cavity block 21, an upper die 20, an elevating plate 18, supporting shafts 13, an upper plate 14, a base plate 15, a servomotor 16, and a reduction gear 17.

The lower die 12 is mounted on an upper surface of the base support 11. The supporting shafts 13 are secured on four corners of the base support 11 around the lower die 12 for supporting the upper plate 14. The supporting shafts 13 extend through the elevating plate 18. The elevating plate 18 has disposed on its bottom surface the upper die 20. On the upper plate 14, the base plate 15 is disposed. On the base plate 15, the servomotor 16 and the reduction gear 17 are installed.

Figure 2:
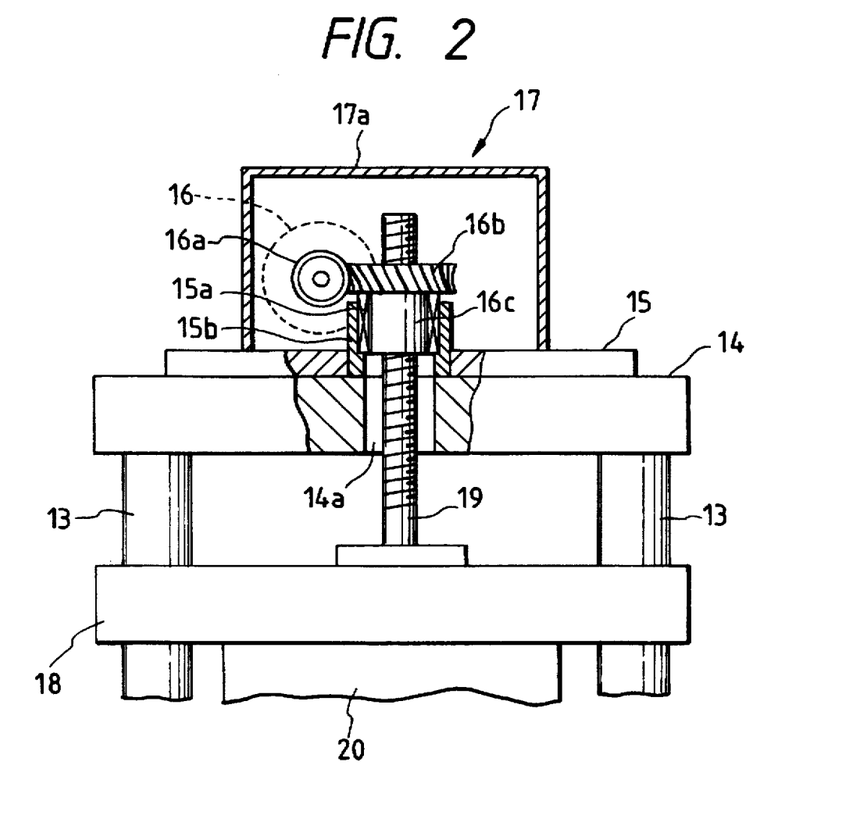
FIG. 2 is a partial cross sectional view which shows the electronic device packaging apparatus shown in FIG. 1.

The reduction gear 17 includes a cover 17a, a worm 16a connected to an output shaft of the servomotor 16, a worm wheel 16b meshing with the worm 16a, a nut 16c firmly fixed on a lower surface of the worm wheel 16b, and a feed screw 19 (i.e., an output shaft of the reduction gear) extending through the nut 16c and the worm wheel 16b. The nut 16c is rotatably supported by a bearing 15a. The bearing 15a is mounted by a bearing support member 15b which is firmly inserted into a bore formed in the base plate 15. The feed screw 19 connects with the elevating plate 18 through a bore 14a formed in the upper plate 14. In operation, when the servomotor 16 is turned on to rotate in a normal direction, it will cause the feed screw 19 to move vertically to displace the elevating plate 18 downward along the supporting shafts 13 until the upper die 20 engages the lower die 12. When the servomotor 16 is reversed, it will cause the elevating plate 18 to be moved upward along the supporting shafts 13 so that the upper die 20 is lifted out of engagement with the lower die 12 to expose the upper surface of the lower die 12.

Figure 3:
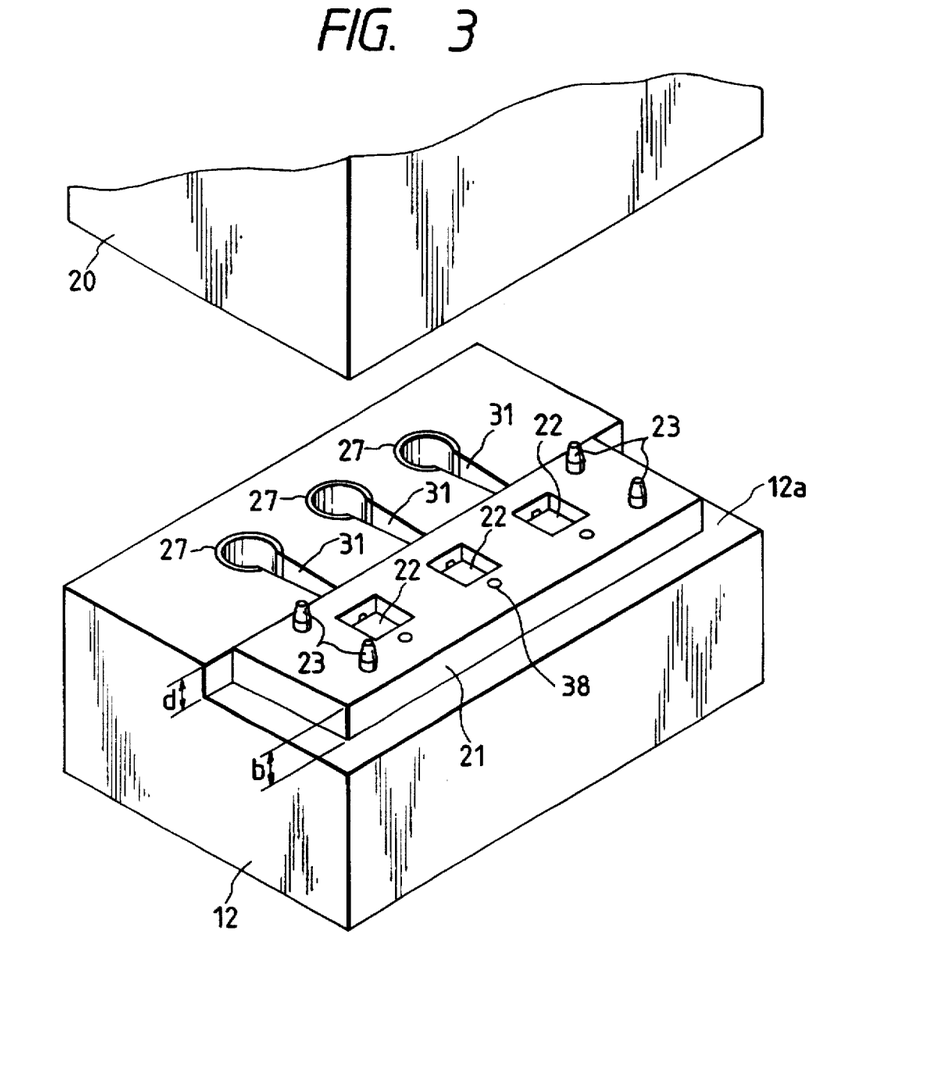
FIG. 3 is a perspective view which shows upper and lower dies for packaging chips mounted on a circuit substrate with molding.
Figure 10:
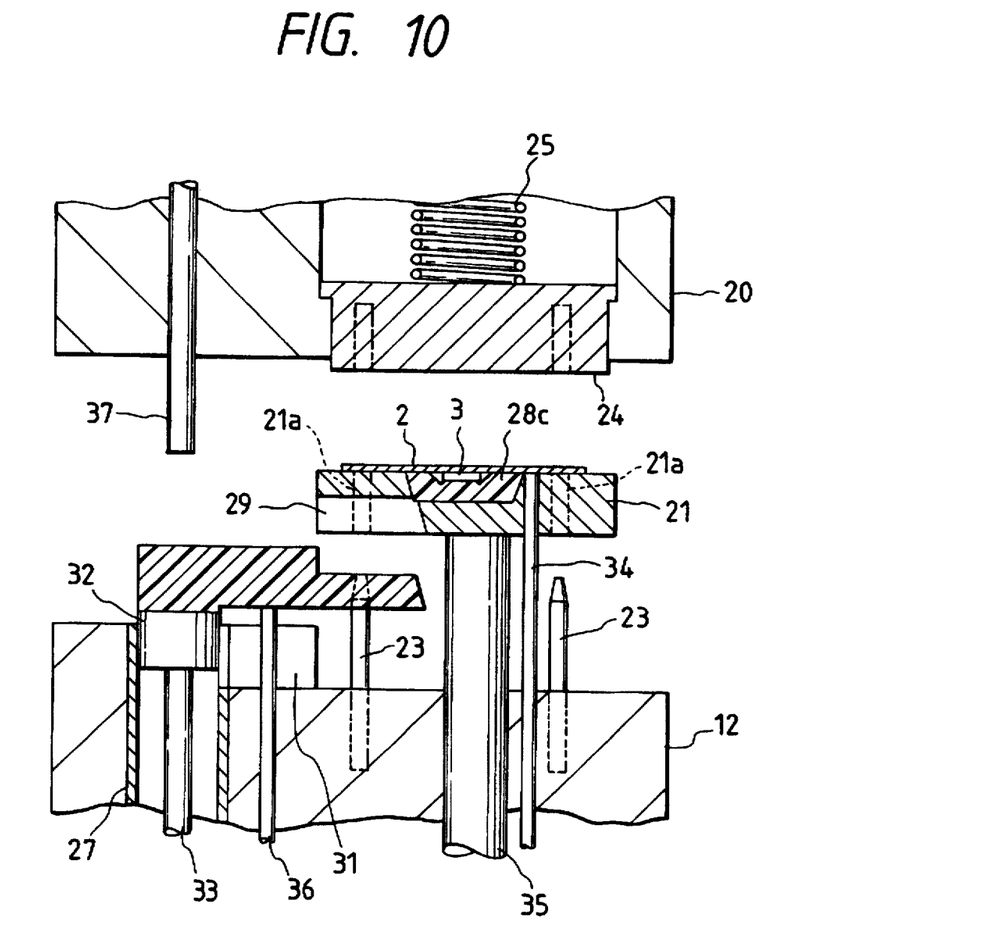
Figure 13:
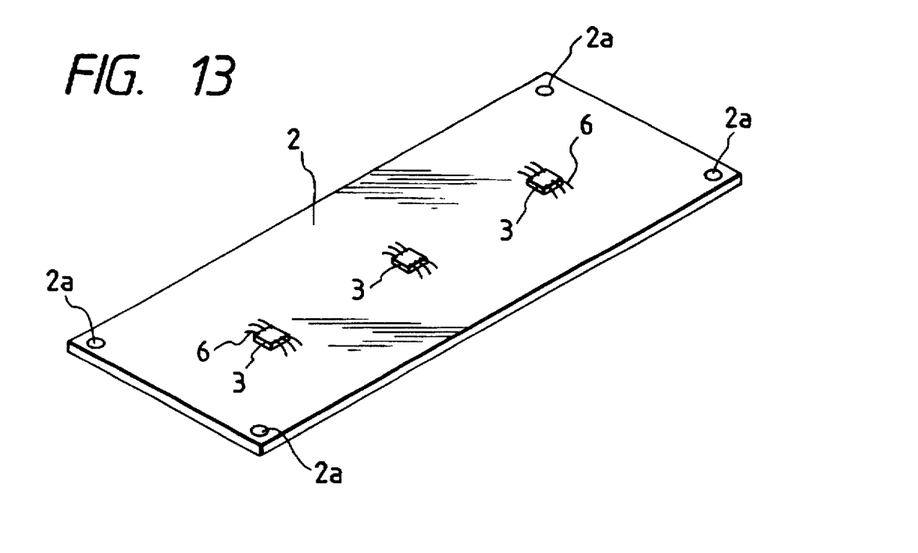
FIG. 13 is a perspective view which shows chips mounted on a circuit substrate.

The lower die 12, as shown in FIG. 3, has a stepped surface 12a which is lowered from an upper surface 12b by a height d. On the stepped surface 12a, the cavity block 21 having a thickness d is mounted so that it lies flush with the upper surface 12b. The cavity block 21 has formed in its upper surface three cavities 22. Four positioning pins 23 for positioning a circuit substrate 2 shown in FIG. 13, are so provided on the stepped surface 12a of the lower die 12 as to project partially from the cavity block 21 through holes 21a, as shown in FIG. 10, formed in the cavity block. The positioning of the circuit substrate 2 is accomplished by aligning positioning holes 2a formed in corners of the circuit substrate 2 with the positioning pins 23 with a chip-mounting surface of the circuit substrate 2 being oriented downward. The three cavities 22 are formed in the cavity block 21 at locations coincident with chips 3 mounted on the circuit substrate 2, as shown in FIG. 13.

Figure 7:
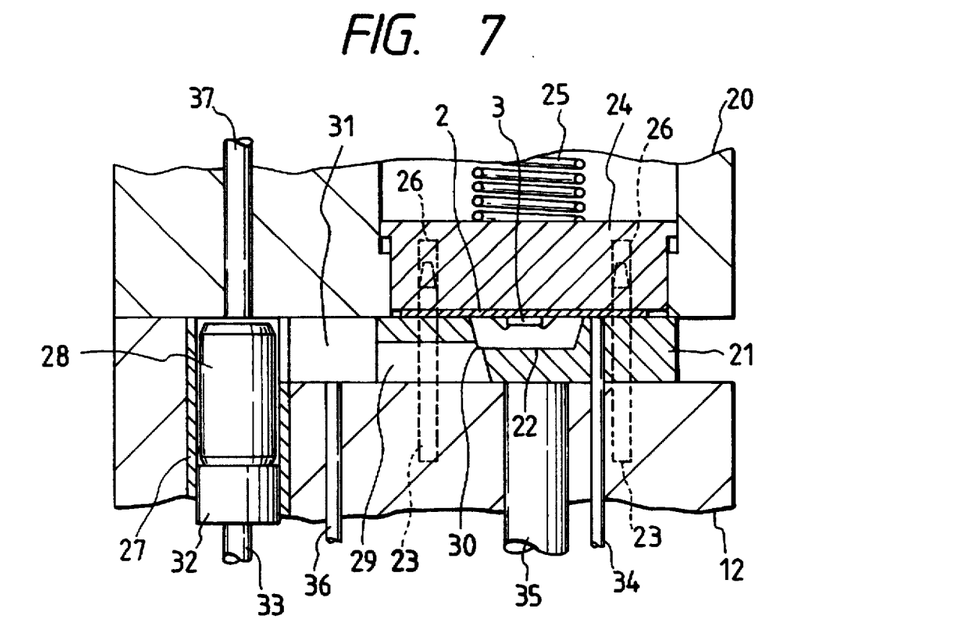
FIG. 7 is a cross sectional view which shows upper and lower dies of the electronic device packaging apparatus shown in FIG. 1 which are in engagement with each other.

The upper die 20, as shown in FIG. 7, has disposed therein a pressure block 24 which is urged downward by a coil spring 25. Holes 26 are drilled in the pressure block 24 in alignment with the positioning pins 23 of the lower die 12. When the servomotor 16 is rotated in the normal direction, the upper die 20 is, as discussed above, moved downward on the upper surface of the lower die 12. The pressure block 24 then urges the circuit substrate 2 against the upper surface of the cavity block 21 by virtue of a spring force of the spring 25. The circuit substrate 2 is, thus, firmly retained between the pressure block 24 and the cavity block 21.

Figure 4:
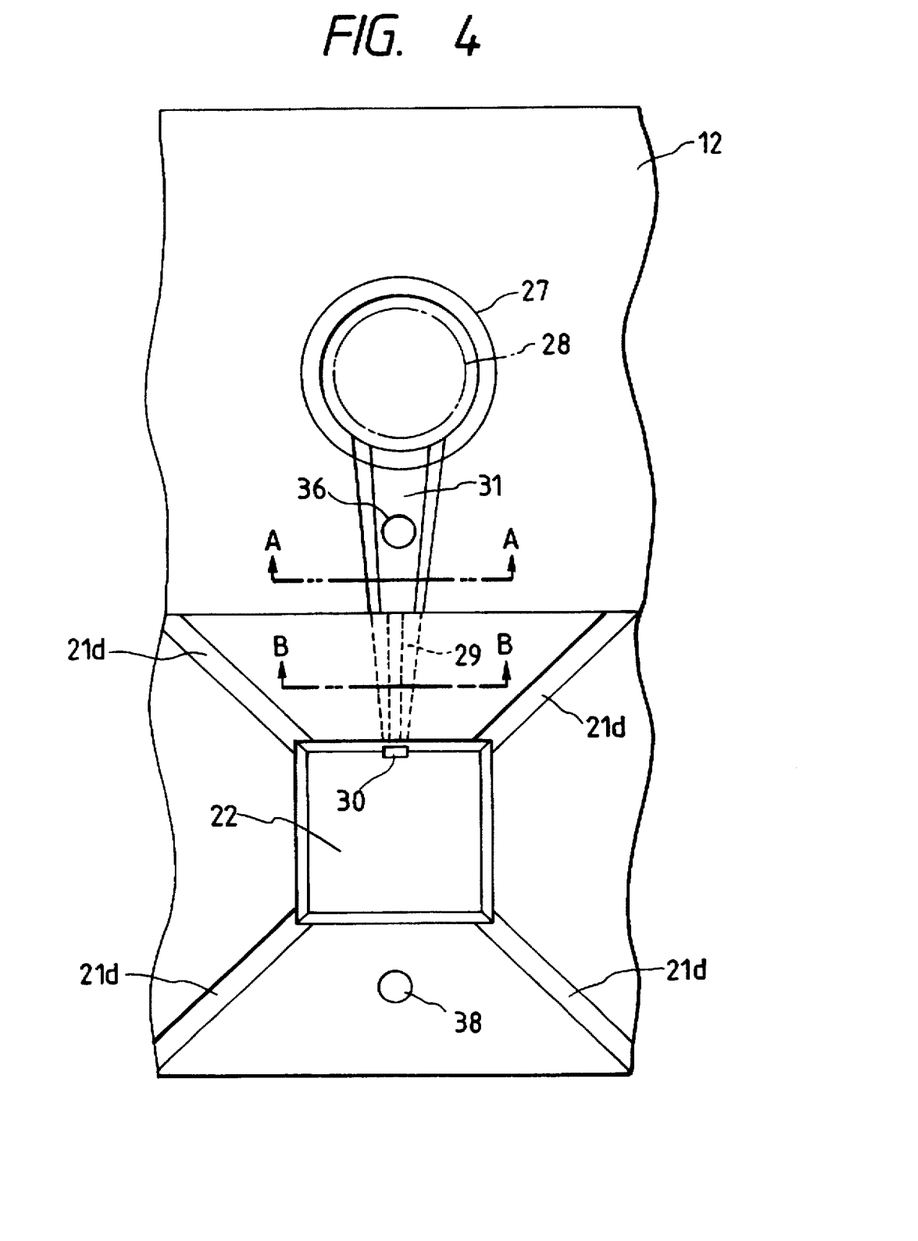
FIG. 4 is a partial plan view which shows a lower die of the electronic device packaging apparatus shown in FIG. 1.
Figure 5A:
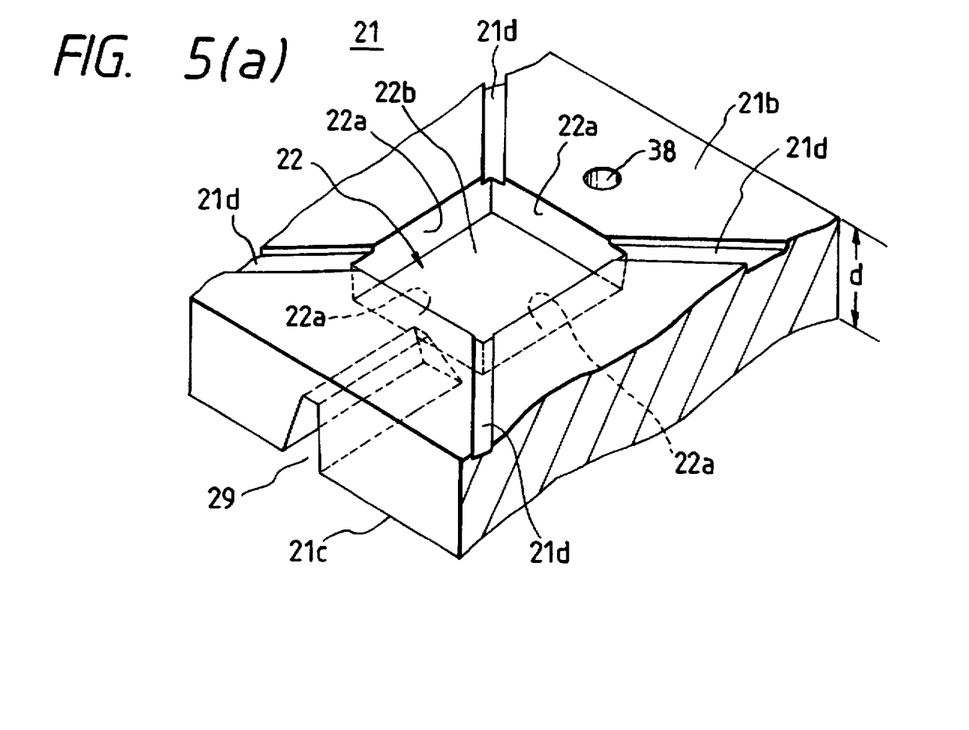
FIG. 5(a) is a partial perspective view which shows one of cavities formed on a lower die of the electronic device packaging apparatus shown in FIG. 1.
Figure 5B:
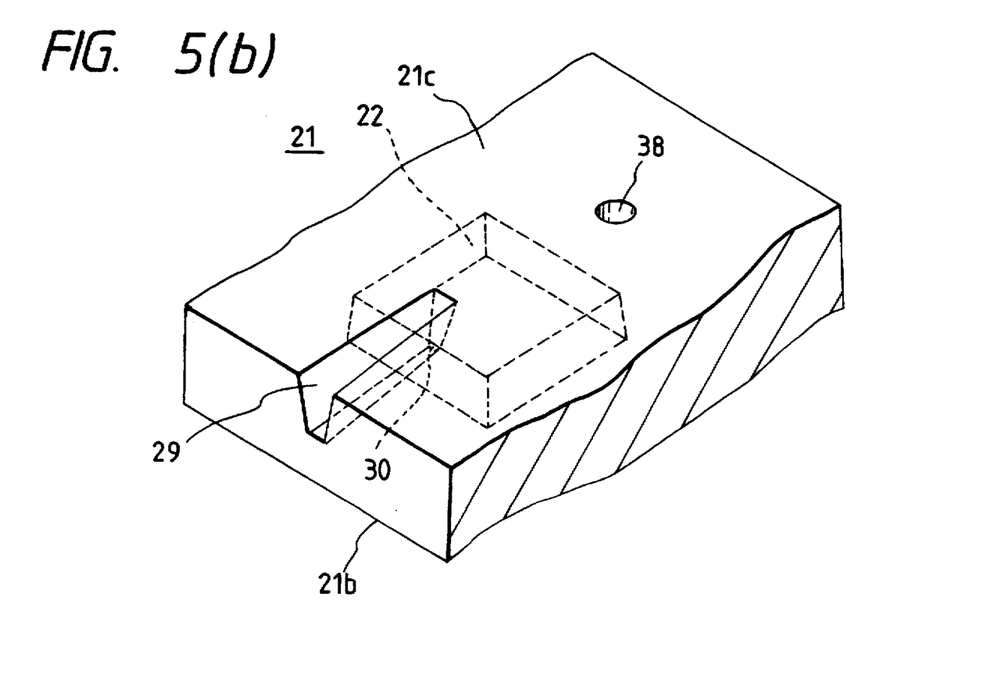
FIG. 5(b) is a partial perspective view which shows a reverse side of the lower die illustrated in FIG. 5(a)
Figure 6A:
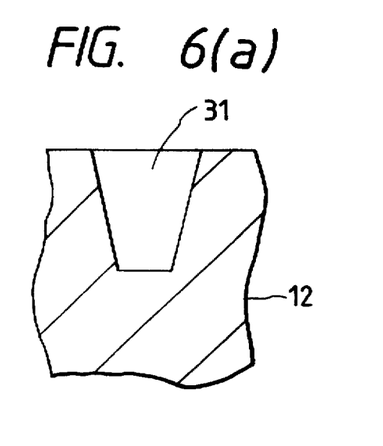
FIG. 6(a) is a cross sectional view taken along the line A—A in FIG. 4.
Figure 6B:
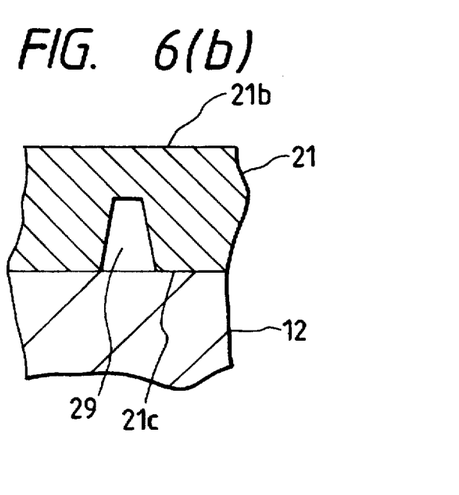
FIG. 6(b) is a cross sectional view taken along the line B—B in FIG. 4.

FIG. 5(a) shows one of the cavities 22 formed in the cavity block 21. FIG. 5(b) shows the bottom of the cavity block 21. FIG. 6(a) is a cross sectional view taken along the line A—A in FIG. 4. FIG. 6(b) is a cross sectional view taken along the line B—B in FIG. 4.

Each of the cavities 22 is, as shown in FIG. 5(a), defined by side walls 22a and a bottom wall 22b, and is of a substantially square shape (see FIG. 4). In the bottom 21c of the cavity block 21, grooves 29 are, as shown in FIG. 5(b), formed which communicate with the cavities 22 through gate holes 30, respectively. The grooves 29 also communicate through the other ends with runners 31, as seen in FIGS. 3 and 4, formed in the upper surface 12b of the lower die 12. Each of the grooves 29 is so defined by tapered side walls widening toward the bottom 21c of the cavity block 21 as to permit a resin material setting therein to be removed easily.

Additionally, in the cavity block 21, pin holes 38 are formed into which first ejector pins 34, as will be described later in detail, are inserted, respectively.

With the thus constructed cavity block 21, the depth of each of the cavities 22 may be set to agree with the thickness of the package 28c of the electronic device 1, as discussed in the introductory part of this application with reference to FIG. 12, without changing the thickness d of the cavity block 21. Therefore, when packaging thin electronic devices, it is possible to make the cavities 22 shallow without having to decrease the thickness of the cavity block 21 itself.

The cavity block 21, as shown in FIGS. 4 and 5(a), further has formed in the upper surface of the cavity block 21 vent channel outlets 21d each having a depth of less than 30 µm and a width of 300 µm. The vent channel outlets 21d extend in a radial direction from corners of each of the cavities 22 for discharging air existing in the cavity into which a melted resin material is being injected. Note that the melted resin material contains particles having a size of about 50 µm (usually called a filler), and thus does not leak outside through the vent channel outlets 21d. If the melted resin material slightly leaks into the vent channel outlets 21d and is left on the circuit substrate 2, it does not affect the quality of the electronic device 1.

The lower die 12, as shown in FIG. 3, has three pots 27 formed in the upper surface 12b. In each of the pots 27, a cylindrical raw resin material, usually called a tablet, is disposed. As can be seen in FIGS. 3, 4, and 7, the runners 31 are formed in the lower die 12 to establish fluid communications between the pots 27 and the grooves 29 of the cavity block 21, respectively.

Each of the pots 27, as shown in FIG. 7, has disposed therein a plunger 32 which is mounted on an end of a rod 33. A heater (not shown) is provided in the lower die 12 for each of the pots 27 which heats the raw resin material 28 to melt it. The melted resin material is then injected by the plunger 32 being elevated by the rod 33 into each of the cavities 22 from the gate hole 30 passing through the runner 31 and the groove 29.

As shown in FIG. 7, first ejector pins 34 and second ejector pins 36 are inserted into the lower die 12. Each of the first ejector pins 34 extends through the cavity block 21 to push the circuit substrate 2 upward. Each of the second ejector pins 36 pushes the resin material hardened inside the runner 31. A rod 35 is slidably inserted into the lower die 12 which connects at its end with the cavity block 21. The first ejector pins 34, the second ejector pins 36, and the rod 35 are elevated by a driver unit (not shown). Additionally, the upper die 20 has disposed therein pressure pins 37 each pushing the resin material hardened in the pot 27 in a downward direction.

In operation, when the servomotor 16 is turned on to rotate in the normal direction after the circuit substrate 2 is secured on the cavity block 21, it will cause the upper die 20 to move downward so that the circuit substrate 2 is, as shown in FIG. 7, retained between the cavity block 21 and the pressure block 24.

Figure 8:
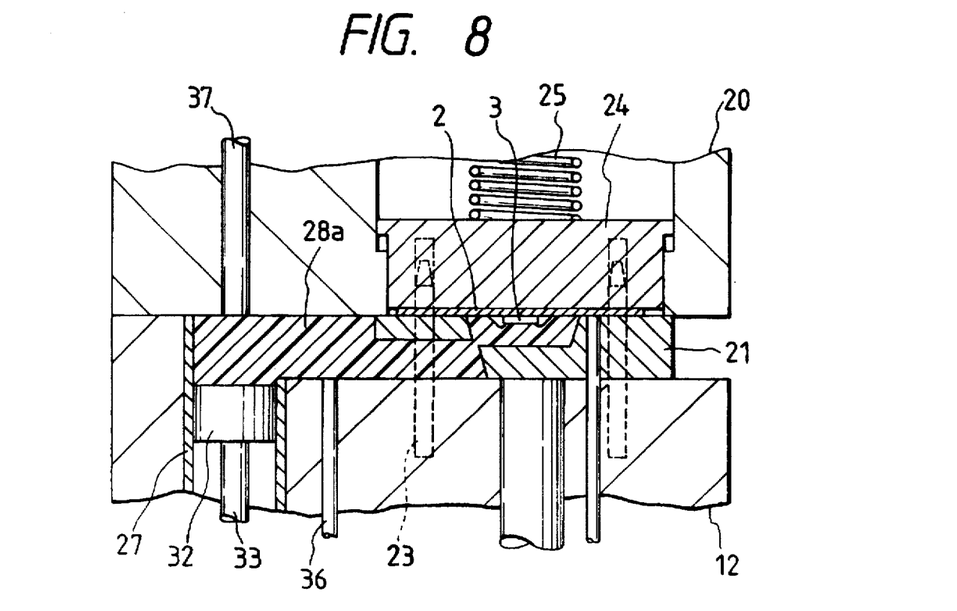
FIGS. 8, 9, and 10 show sequential packaging processes using upper and lower dies.

Subsequently, after the resin materials 28 disposed in the pots 27 are heated and melted completely, the plungers 32 are elevated. The elevation of the plungers causes, as shown in FIG. 8, the melted resin materials 28a to flow out of the spots 27 to the runners 31 and the grooves 29 which are, in turn, injected into the cavities 22 through the gate holes 30. Upon the injection of the melted resin materials 28a, air in the cavities 22 is discharged outside through the vent channel outlets 21d formed in the upper surface 21b of the cavity block 21. Since the specific gravity of the air is usually smaller than that of the melted resin materials 28a, the air existing in lower portions of the cavities 22 escapes upward into the vent channel outlets 21d. This eliminates the possibility of defects, called voids, being generated in the resin materials within the cavities 22. The chips 33 disposed in the cavities 22 are then sealed with the melted resin materials 28a. After the melted resin materials 28a are injected into the cavities 22 in the above manner, they are held under pressure for about 30 to 50 sec until the melted resin materials 20a are hardened completely.

Figure 9:
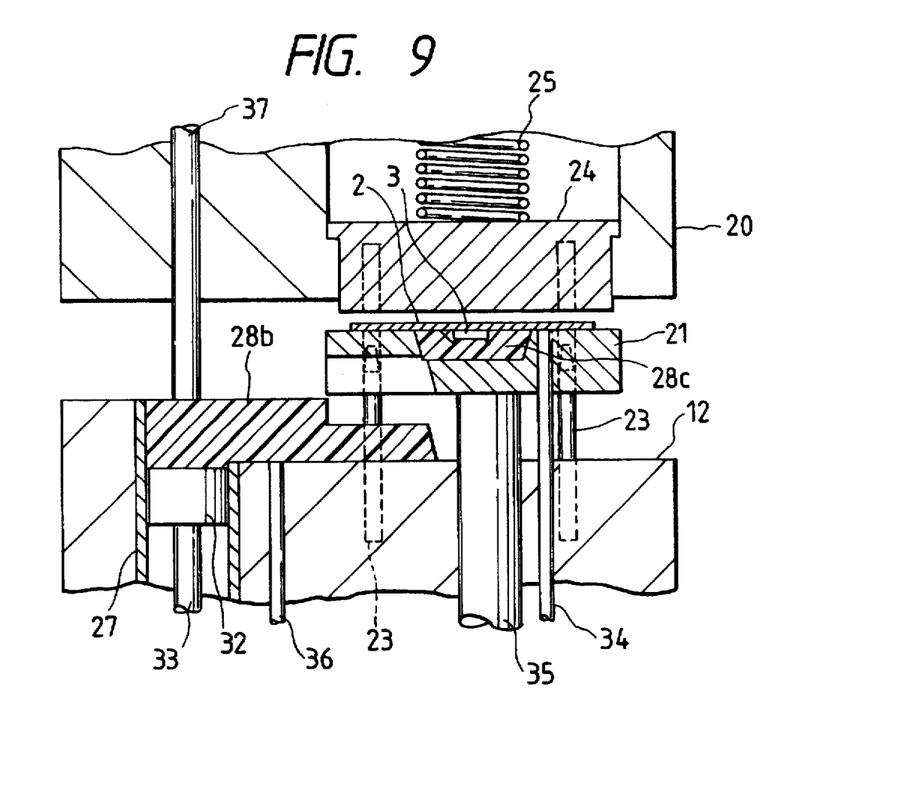

After the melted resin materials 20a are hardened completely to form resin blocks, the servomotor 16 is reversed to elevate the upper die 20, exposing the upper surface of the cavity block 21. The pressure pins 37, as shown in FIG. 9, are then displaced downward to press the upper surfaces of the resin blocks hardened in the pots 27, the runners 31, and the grooves 29. The rod 35 is then moved upward to lift the cavity block 21, so that the resin blocks are, as shown in FIG. 10, separated at the gate holes 30 into resin blocks 28b and resin packages 28c. In this manner, the chips 3 mounted on the circuit substrate 2 are encased within the resin packages 28c, respectively.

Afterward, the upper die 20 is, as shown in FIG. 10, further moved upward and, at the same time, the rod 35 is further elevated to lift up the cavity block 21. The plungers 32 and the second ejector pins 36 are also moved upward to lift up the resin blocks 28b so that it is removed out of the lower die 12. The circuit substrate 2 with the chips 3 being packaged is then taken out of the cavity block 21 and the resin blocks 28b are removed therefrom. In a subsequent process, the circuit substrate 2 is cut into three pieces to finish an electronic device to an exterior appearance schematically illustrated in FIG. 12.

Figure 11:
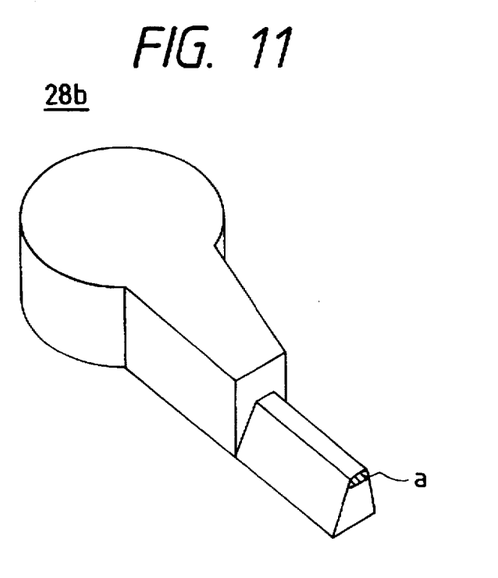
FIG. 11 is a perspective view which shows a resin block formed during molding operations.

FIG. 11 shows one of the resin blocks 28b after having been removed from the cavity block 21 as a waste product. The lower case letter a denotes a broken surface of the resin block 28b separated at the gate hole 30.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modifications to the shown embodiments which can be embodied without departing from the principle of the invention as set forth in the appended claims.

What is claimed is:

1. A process for packaging a chip mounted on a circuit substrate with a resin material which avoids the formation of resin burrs on the chip comprising the steps of:

retaining the circuit substrate on a major surface of a one-piece cavity block so that the chip is disposed in a recessed portion formed in the major surface, and surrounded by a continuous wall of said cavity, the cavity block having formed in a surface opposite the major surface a tapered groove communicating with the bottom of the recessed portion said groove having tapered side walls which widen towards the bottom of said recessed portion;

pressing the circuit substrate against the major surface of the cavity block;

injecting a melted resin material into the recessed portion formed in the cavity block through the groove to package the chip said resin being contained within said continuous wall inhibiting the formation of burrs on said chip package wherein said resin material hardens forming said chip package and said tapered groove facilitating removal of hardened resin, removing the hardened resin out of the groove for separation from said chip package; and removing said chip package out of the recessed portion.

2. The process for packaging a chip according to claim 1, wherein said step of retaining the chip and circuit substrate in a recess portion of a cavity block includes positioning said chip and substrate between an upper die-member and a lower die-member which supports said cavity block; and said step of pressing includes applying a clamping force between said upper and lower die-members.

3. The process for packaging a chip according to claim 2, further comprising separating said upper and lower dies following hardening of said resin material; and forcing said chip and substrate away from said cavity block.

* * * * *